United States Patent
Mohri et al.

(10) Patent No.: US 7,318,352 B2
(45) Date of Patent: Jan. 15, 2008

(54) METHOD FOR PRODUCING STRESS IMPEDANCE EFFECT ELEMENT AND THAT ELEMENT

(75) Inventors: Kaneo Mohri, Nagoya (JP); Masaki Mori, Nagoya (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 97 days.

(21) Appl. No.: 10/507,373

(22) PCT Filed: Mar. 27, 2003

(86) PCT No.: PCT/JP03/03826

§ 371 (c)(1),
(2), (4) Date: Feb. 8, 2005

(87) PCT Pub. No.: WO03/083423

PCT Pub. Date: Oct. 9, 2003

(65) Prior Publication Data

US 2006/0225512 A1    Oct. 12, 2006

(30) Foreign Application Priority Data

Mar. 29, 2002 (JP) ............................. 2002-096710

(51) Int. Cl.
G01B 7/16 (2006.01)
G01L 1/00 (2006.01)

(52) U.S. Cl. ...................................................... 73/779

(58) Field of Classification Search ................. 73/779, 73/769
See application file for complete search history.

(56) References Cited

U.S. PATENT DOCUMENTS

| 3,465,306 | A | * | 9/1969 | Snyder ......................... 365/139 |
|---|---|---|---|---|
| 4,894,615 | A | * | 1/1990 | Mermelstein ................ 324/244 |
| 5,315,881 | A | * | 5/1994 | Savage et al. .......... 73/862.333 |
| 5,502,381 | A | * | 3/1996 | Saitou .......................... 324/209 |
| 5,600,239 | A | * | 2/1997 | Hathaway et al. ........... 324/209 |
| 5,889,403 | A | * | 3/1999 | Kawase ....................... 324/249 |
| 6,231,968 | B1 | * | 5/2001 | Hiramoto et al. .......... 428/811.5 |
| 6,456,068 | B1 | * | 9/2002 | Kawase ....................... 324/249 |
| 6,472,868 | B1 | * | 10/2002 | Takayama et al. ........... 324/249 |
| 6,650,112 | B2 | * | 11/2003 | Takayama et al. ........... 324/249 |
| 6,861,838 | B2 | * | 3/2005 | Kawase ....................... 324/249 |
| 2001/0030537 | A1 | * | 10/2001 | Honkura et al. ............. 324/249 |

FOREIGN PATENT DOCUMENTS

| JP | 10-170355 | 6/1998 |
|---|---|---|
| JP | 2000-081471 | 3/2000 |
| JP | 2002-078684 | 3/2002 |
| JP | 2002-090432 | 3/2002 |

* cited by examiner

Primary Examiner—Michael Cygan
Assistant Examiner—Octavia Davis
(74) Attorney, Agent, or Firm—Oblon, Spivak, McClelland, Maier & Neustadt, P.C.

(57) ABSTRACT

A method for producing a stress impedance effect element, the method including: connecting opposite ends of a magnetostrictive amorphous thin wire and respective electrodes by ultrasonic bonding; forming a groove in an elastic thin substrate having a thermal expansion coefficient equal to that of the magnetostrictive amorphous thin wire; installing the magnetostrictive amorphous thin wire in the groove; and bonding together the magnetostrictive amorphous thin wire and the elastic thin substrate by applying an insulating adhesive across the magnetoresistive amorphous thin wire.

6 Claims, 3 Drawing Sheets

METHOD FOR PRODUCING STRESS IMPEDANCE EFFECT ELEMENT AND THAT ELEMENT

TECHNICAL FIELD

The present invention relates to a dynamic quantity sensor such as a strain gauge, stress sensor, accelerator sensor, and more specifically, to a high-sensitivity dynamic quantity sensor based on the stress impedance effect and its applications.

BACKGROUND ART

For conventional strain gauges, resistance wire strain gauges and semiconductor strain gauges are in widespread practice, and the gauge factor (the rate of change of an impedance per unit strain) is about 2 for resistance wire strain gauges, and about 150 for semiconductor gauges.

However, these gauge factor values are difficult to implement detection sensors for detecting minute strains and acceleration required for bioinstrumentation and high-accuracy industrial instrumentation. Strain gauges (stress sensors) having higher gauge factors must be developed.

With this being the situation, the present inventor previously invented a high-sensitivity strain gauge (stress impedance effect element) based on the stress impedance effect of a magnetostrictive amorphous wire (Japanese Unexamined Patent Application Publication No. 10-170355). This stress impedance effect element has achieved a gauge factor of 4000 using a CoSiB amorphous wire with a diameter of 20 µm, thereby allowing the detection of minute strain, stress, acceleration, and the like.

DISCLOSURE OF INVENTION

However, because the amorphous wire is a hard and stiff elastic body with a Vickers hardness of about 1000 and has a silicon oxide film as its surface layer, the formation of electrodes by soldering has been difficult. Also, when the stress impedance effect element constitutes an acceleration sensor, because its substrate and the amorphous wire make line contact with each other, the bonding therebetween has been imperfect. These problems have made difficult the mounting of the stress impedance effect element.

Accordingly, the object of the present invention is to provide a method for producing a stress impedance effect element that can be rigidly mounted, and that element.

In order to achieve the above-described object, the present invention provides:

[1] a method for producing a stress impedance effect element, the method comprising connecting opposite ends of a magnetostrictive amorphous thin wire and respective electrodes by ultrasonic bonding;

[2] the method for producing a stress impedance effect element as recited in the above [1], wherein the magnetostrictive amorphous thin wire is a negative magnetostrictive amorphous thin wire;

[3] the method for producing a stress impedance effect element as recited in the above [1], wherein the magnetostrictive amorphous thin wire has a diameter of not more than 20 micrometers;

[4] the method for producing a stress impedance effect element as recited in the above [1], the method comprising:

forming a groove in an elastic thin substrate having a thermal expansion coefficient equal to that of the magnetostrictive amorphous thin wire; and installing the magnetostrictive amorphous thin wire in the groove, and bonding the magnetostrictive amorphous thin wire to the groove;

[5] a stress impedance effect element comprising electrodes each formed at a respective one of the opposite ends of a magnetostrictive amorphous thin wire, by ultrasonic bonding;

[6] the stress impedance effect element as recited in the above [5], wherein the magnetostrictive amorphous thin wire comprises a negative magnetostrictive amorphous thin wire;

[7] the stress impedance effect element as recited in the above [5], wherein the magnetostrictive amorphous thin wire has a diameter of not more than 20 micrometers; and

[8] the stress impedance effect element as recited in [5], wherein a groove is formed in an elastic thin substrate having a thermal expansion coefficient equal to that of the magnetostrictive amorphous thin wire, and wherein the magnetostrictive amorphous thin wire is installed in the groove and bonded to the groove.

BEST MODE FOR CARRYING OUT THE INVENTION

Hereinafter, an embodiment according to the present invention will be described in detail.

Figure 2:
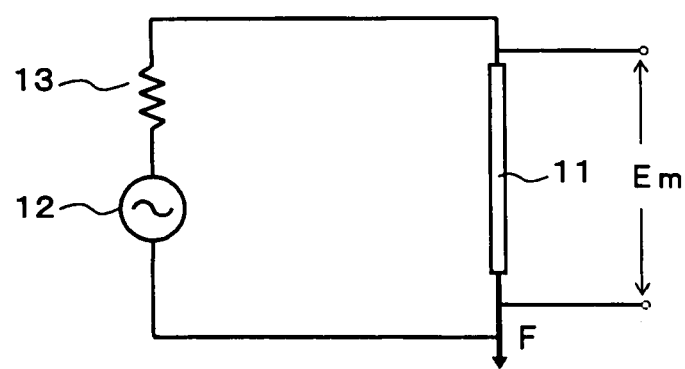
FIG. 2 shows a high-sensitivity stress detection element according to the present invention and a circuit including it.
Figure 3:
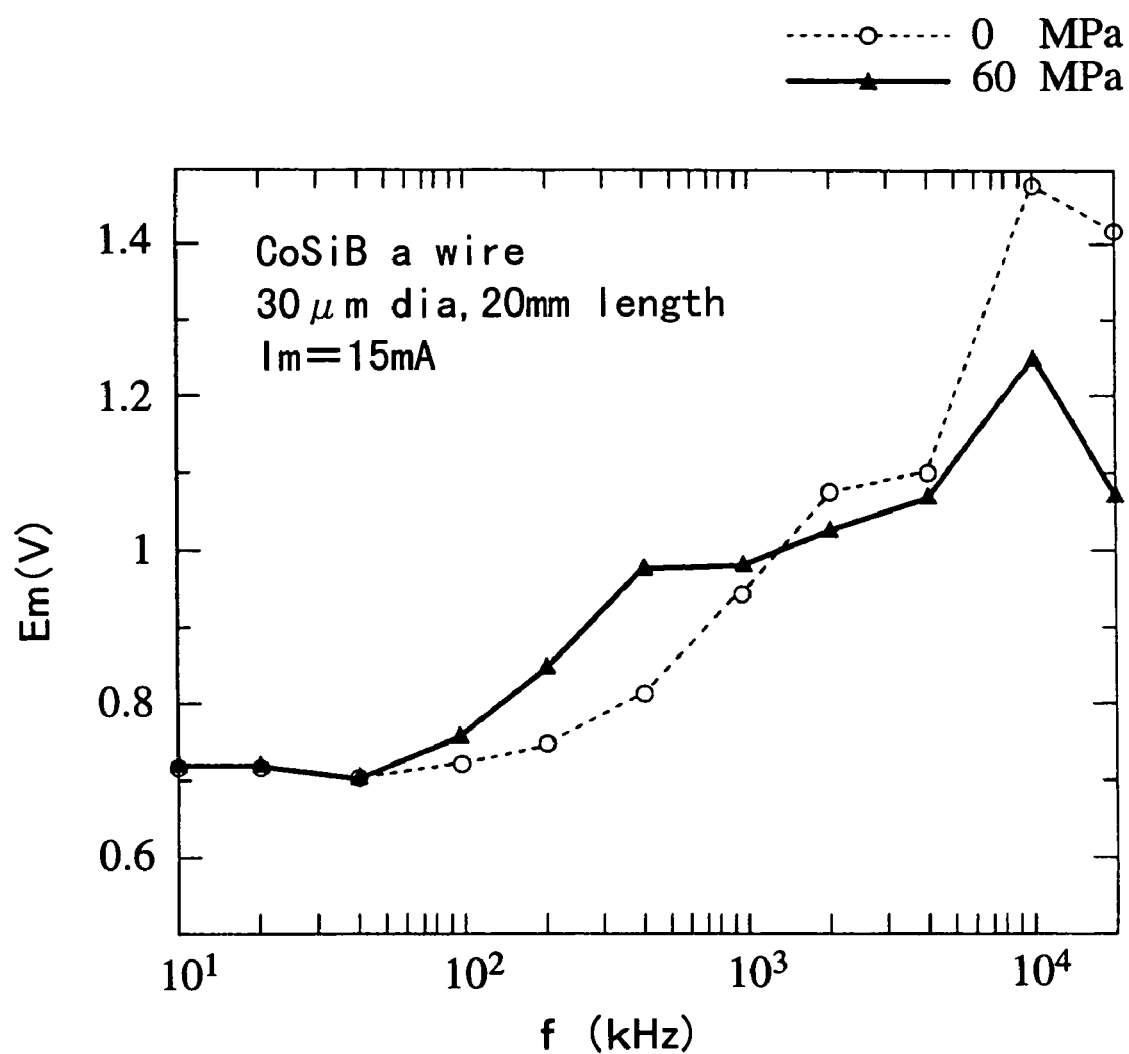
FIG. 3 is a frequency characteristic (1) of the variation in voltage amplitude by the stress, of the high-sensitivity stress detection element according to the present invention.

FIG. 2 shows a high-sensitivity stress detection element according to the present invention and a circuit including it; and FIG. 3 shows a frequency characteristic (1) of the variation in voltage amplitude by the stress, of the high-sensitivity stress detection element.

In FIG. 2, reference numeral 11 denotes a negative magnetostrictive amorphous wire comprising $Co_{72.5}Si_{12.5}B_{15}$ (diameter=30 µm, length=20 mm; this amorphous wire is obtained by: drawing an amorphous wire with a diameter of 130 µm made by a rotation underwater rapid quenching method, and after heating it at 475° C. for 2 min with a tensile force of 4 kg/mm² applied, quenching it to room temperature; magnetostriction value=$-3 \times 10^{-6}$). A sine-wave alternating current power supply 12 is connected to this amorphous wire 11. Reference numeral 13 denotes an internal resistor for maintaining constant the amplitude of the alternating current.

FIG. 3 shows measured results of amplitudes Em of voltages occurring across the opposite ends of the amorphous wire 11 when a tensile force is applied to the amorphous wire 11, and sine-wave alternating currents having frequencies f and an amplitude of 15 mA are applied to the amorphous wire 11 by the sine-wave alternating current power supply 12.

As can be seen from FIG. 3, the application of a tensile force F of approximately 6 kg/mm² (60 MPa) to the amorphous wire 11 increases the amplitude Em of voltage across the opposite ends of the amorphous wire 11 in the range of frequency f from 50 kHz to 1 MHz, and reduces it in the frequency range from 1 MHz to about 20 MHz. In the range over 50 kHz, the amplitude Em of voltage across the opposite ends of the amorphous wire 11 increases with the frequency f. This shows an appearance of the skin effect in the amorphous wire 11.

Figure 4:
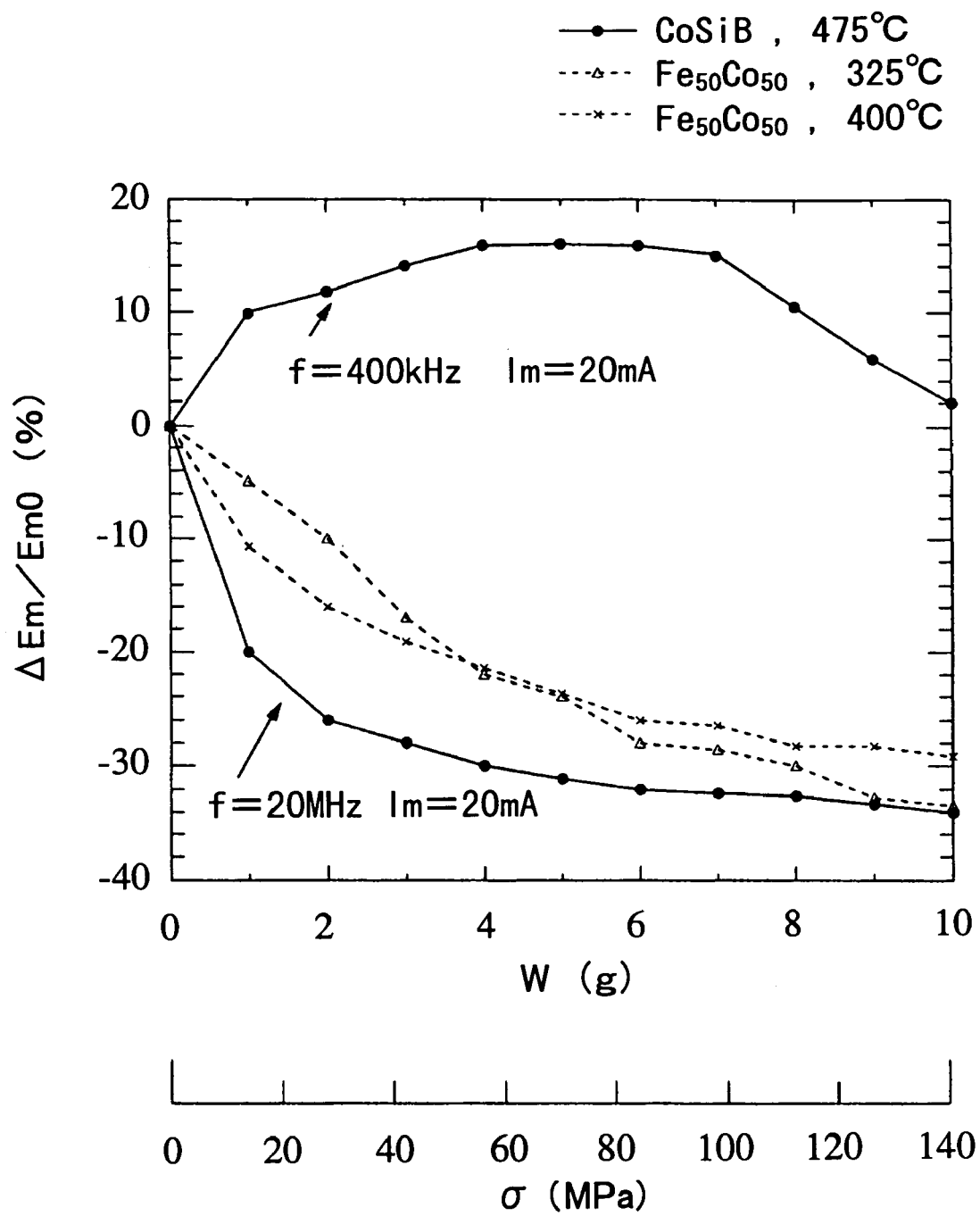
FIG. 4 is a frequency characteristic (2) of the variation in voltage amplitude by the stress, of the high-sensitivity stress detection element according to the present invention.

FIG. 4 shows a frequency characteristic (2) of the variation in voltage amplitude by the stress at frequencies of 400 kHz and 20 MHz, of the above-described high-sensitivity stress detection element.

In this embodiment, sine-wave alternating currents having frequencies of 400 kHz and 20 MHz and an amplitude of 20 mA is applied, and a tensile load W is provided to the CoSiB amorphous wire shown in FIG. 3 and a positive magnetostrictive amorphous wire comprising $(Fe_{0.5} Co_{0.5})_{72.5} Si_{12.5} B_{15}$ (diameter=30 μm, length=20 mm, magnetostriction value=$5 \times 10^{-6}$). The measured results are of rates of the change in the amplitude Em of voltage across the opposite ends of these wires.

For f=20 MHz, with the CoSiB wire, the application of a load of 1 g (tensile force=13 MPa) reduces the amplitude Em of voltage across the opposite ends of these wires by 20%. Because the CoSiB amorphous wire has a maximum tensile strength of 306 MPa and maximum strain (elongation rate) of 3.4%, its strain gauge factor [(rate of the change in electromagnetic quantity)/(elongation rate)] becomes 1286. This is a very high value about 6.5 times the gauge factor of about 200 owned by a conventional semiconductor strain gauge having a highest sensitivity. Even the FeCoSiB wire exhibits a gauge factor of about 400; this shows that a thin amorphous wire subjected to wire tension annealing exhibits a very high gauge factor.

Hereinafter, characteristics of the present invention will be described.

Figure 1:
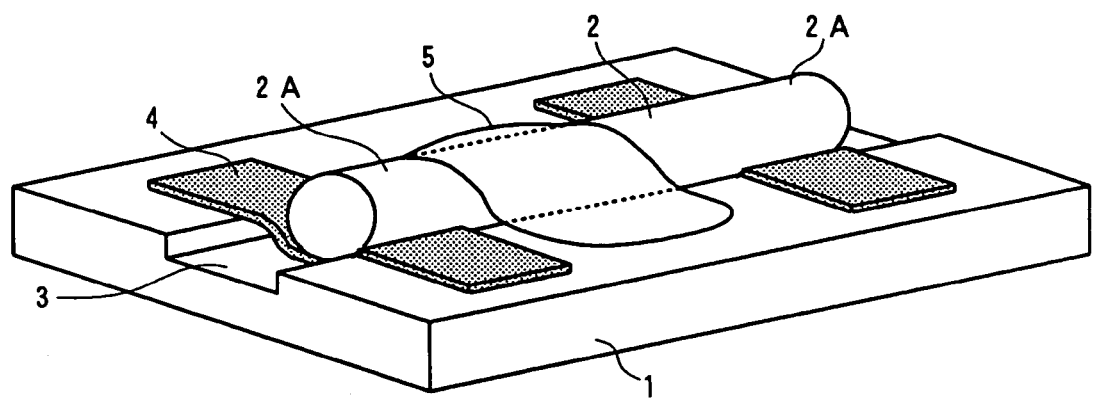
FIG. 1 is a perspective view showing a mounted state of a stress impedance effect element according to an embodiment of the present invention.

FIG. 1 is a perspective view showing a mounted state of the stress impedance effect element according to the embodiment of the present invention.

In FIG. 1, reference numeral 1 denotes a glass ceramic substrate having a thermal expansion coefficient equal to that of an amorphous wire, numeral 2 denotes the amorphous wire (magnetostrictive amorphous wire), 3 denotes a groove formed in the glass ceramic substrate 1, 4 denotes electrodes formed across the groove 3 and comprising a Cu or NiFe film, and 5 denotes an insulating adhesive to be applied on the magnetostrictive amorphous wire 2. In this embodiment, an amorphous wire (magnetostrictive amorphous wire), especially a negative magnetostrictive amorphous wire that has a diameter of not more than 20 μm can be used.

In this embodiment, the connection between electrodes 4 and the opposite end portions 2A of the magnetostrictive amorphous wire 2 is established by ultrasonic bonding. Specifically, the formation of the electrodes is performed by ultrasonic bonding in which an electroless plating film or electroless nickel plating film is provided as a primary plating.

Although the formation of electrodes by soldering has been difficult because the amorphous wire is a hard and stiff elastic body with a Vickers hardness of about 1000 and has a silicon oxide film as a surface layer, this embodiment allows a reliable formation of electrodes by using ultrasonic bonding.

Also, since the substrate has a thermal expansion coefficient equal to that of the amorphous wire, there is no risk of the amorphous wire falling off the substrate.

Furthermore, when the stress impedance effect element constitutes an acceleration sensor, because the substrate and the amorphous wire has conventionally made line contact with each other, the bonding therebetween has been imperfect. However, in this embodiment, the amorphous wire 2 and the groove 3 are caused to make surface contact with each other by forming the groove 3 in the substrate 1, thereby allowing the amorphous wire 2 to be stably held.

Moreover, since the amorphous wire 2 is fixed by the insulating adhesive 5, rigid mounting can be achieved.

The present invention is not limited to the above-described embodiment. Various modifications may be made therein on the basis of the true spirit of the present invention, and these modifications are not excluded from the scope of the present invention.

As described above in detail, according to the present invention, the magnetostrictive amorphous thin wire can be reliably mounted. In other words, the magnetostrictive amorphous thin wire is reliably connected to the electrodes by ultrasonic bonding. The magnetostrictive amorphous thin wire can also stably held to the groove formed in the substrate, and can be reliably fixed thereto by the insulating adhesive.

Thus, the magnetostrictive amorphous thin wire can be fixed to the substrate stably and rigidly, thereby providing an impedance effect element that is resistant to an impactive force.

INDUSTRIAL APPLICABILITY

The method for producing a stress impedance effect element, and that element according to the present invention can be expected to be widely used for a high-sensitivity dynamic quantity sensor based on the stress impedance effect.

The invention claimed is:

1. A method for producing a stress impedance effect element, the method comprising:
    forming a groove in an elastic thin substrate;
    forming electrodes across the groove;
    installing a magnetostrictive amorphous thin wire in the groove, the magnetostrictive amorphous thin wire having a thermal expansion coefficient equal to that of the elastic thin substrate;
    connecting opposite ends of the magnetostrictive amorphous thin wire and the respective electrodes by ultrasonic bonding, the electrodes formed under the magnetostrictive amorphous thin wire; and
    bonding together the magnetostrictive amorphous thin wire installed in the groove and the elastic thin substrate by applying an insulating adhesive such that the insulating adhesive crosses over the magnetostrictive amorphous thin wire.

2. The method for producing a stress impedance effect element according claim 1, wherein the magnetostrictive amorphous thin wire is a negative magnetostrictive amorphous thin wire.

3. The method for producing a stress impedance effect element according claim 1, wherein the magnetostrictive amorphous thin wire has a diameter of not more than 20 micrometers.

4. A stress impedance effect element comprising:
    (a) an elastic thin substrate having a groove formed therein;
    (b) electrodes formed across the groove;
    (c) a magnetostrictive amorphous thin wire provided in the groove and having a thermal expansion coefficient equal to that of the elastic thin substrate, opposite ends of the magnetostrictive amorphous thin wire connected to the respective electrodes by ultrasonic bonding, the electrodes formed under the magnetostrictive amorphous thin wire; and (d) an insulating adhesive applied over the magnetostrictive amorphous thin wire provided in the groove.

5. The stress impedance effect element according claim 4, wherein the magnetostrictive amorphous thin wire comprises a negative magnetostrictive amorphous thin wire.

6. The stress impedance effect element according claim 4, wherein the magnetostrictive amorphous thin wire has a diameter of not more than 20 micrometers.

* * * * *